US012651614B2

(12) United States Patent
Cho

(10) Patent No.: US 12,651,614 B2
(45) Date of Patent: Jun. 9, 2026

(54) SEMICONDUCTOR APPARATUS WITH ACTIVE INTERNAL POWER CONTROL AND MEMORY SYSTEM INCLUDING THE SAME

(71) Applicant: SK hynix Inc., Icheon-si (KR)

(72) Inventor: Hyun Chul Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 179 days.

(21) Appl. No.: 18/428,302

(22) Filed: Jan. 31, 2024

(65) Prior Publication Data

US 2025/0149069 A1    May 8, 2025

(30) Foreign Application Priority Data

Nov. 8, 2023    (KR) ........................ 10-2023-0153546

(51) Int. Cl.
*G11C 5/14*        (2006.01)

(52) U.S. Cl.
CPC .................................... *G11C 5/147* (2013.01)

(58) Field of Classification Search
CPC ......... G11C 5/147; G11C 5/143; G11C 5/145; G06F 1/3225
See application file for complete search history.

(56) References Cited

U.S. PATENT DOCUMENTS

| | | | | | |
|---|---|---|---|---|---|
| 2002/0167350 | A1* | 11/2002 | Sato | .......................... | G05F 1/46 |
| | | | | | 327/540 |
| 2002/0191467 | A1* | 12/2002 | Matsumoto | ........... | G11C 11/406 |
| | | | | | 365/222 |

| | | | | | |
|---|---|---|---|---|---|
| 2003/0001554 | A1* | 1/2003 | Park | ........................ | G05F 1/465 |
| | | | | | 323/315 |
| 2006/0142977 | A1* | 6/2006 | Oh | ........................ | G11C 29/028 |
| | | | | | 702/190 |
| 2007/0109900 | A1* | 5/2007 | Sakurai | .................. | G11C 5/147 |
| | | | | | 365/185.23 |
| 2008/0111533 | A1* | 5/2008 | Kang | ..................... | G11C 5/147 |
| | | | | | 323/318 |
| 2010/0191987 | A1* | 7/2010 | Furutani | ................ | G11C 5/147 |
| | | | | | 713/300 |
| 2013/0335873 | A1* | 12/2013 | Lee | .......................... | H02H 3/20 |
| | | | | | 361/91.2 |
| 2014/0351609 | A1* | 11/2014 | Shiah | .................... | G06F 1/3275 |
| | | | | | 713/300 |
| 2016/0105182 | A1* | 4/2016 | Kerr | ............... | H03K 19/018521 |
| | | | | | 326/80 |
| 2022/0156004 | A1 | 5/2022 | Na et al. | | |
| 2022/0366942 | A1* | 11/2022 | Lee | ..................... | G11C 29/028 |

FOREIGN PATENT DOCUMENTS

| | | |
|---|---|---|
| KR | 100721082 B1 | 5/2007 |
| KR | 1020120098366 A | 9/2012 |

* cited by examiner

*Primary Examiner* — Khamdan N. Alrobaie

(74) *Attorney, Agent, or Firm* — WILLIAM PARK AND ASSOCIATES LTD.

(57)                ABSTRACT

A semiconductor apparatus includes an internal voltage generation circuit and a control circuit. The internal voltage generation circuit includes a plurality of sub-circuits that receive an external voltage as an input and generate at least one internal voltage based on the external voltage. The control circuit determines where the external voltage falls within a range between a minimum operating voltage and a target operating voltage according to power information and a built-in lookup table and controls the plurality of sub-circuits according to a result of the determination.

16 Claims, 5 Drawing Sheets

103

<u>105</u>

| VINF | Vext | Vmin | Vtgt |
|------|------|------|------|
| 00 | 2.30 ~ 2.57 | | |
| 01 | 2.58 ~ 2.85 | 2.30 | 3.30 |
| 02 | 3.12 ~ 3.37 | | |
| ⋮ | ⋮ | | |

<u>103</u>                     Vext = Vmin

Vmin < Vext < Vtgt

Vmin < Vext < Vtgt

FIG. 4D

103                                          Vext = Vtgt

VCTRL<0>                    VCTRL<1>                    VCTRL<2>

131                         132                         133

| OFF | Vint1 | 142 | OFF | Vint2 | 143 | OFF | 144 → Vint3 |

| SW1(OFF) | | SW2(OFF) | | SW3(ON) |

141

Vext

VCTRL<3>                    VCTRL<4>                    VCTRL<5>

FIG. 4E

103                                          Vext = Vtgt

VCTRL<0>                    VCTRL<1>                    VCTRL<2>

131                         132                         133

| OFF | Vint1 | 142 | OFF | Vint2 | 143 | ON | 144 → Vint3 |

| SW1(OFF) | | SW2(ON) | | SW3(OFF) |

141

Vext

VCTRL<3>                    VCTRL<4>                    VCTRL<5>

500

501

502

HOST

CMD

Vext

DATA

SEMICONDUCTOR
MEMORY
APPARATUS

SEMICONDUCTOR APPARATUS WITH ACTIVE INTERNAL POWER CONTROL AND MEMORY SYSTEM INCLUDING THE SAME

CROSS-REFERENCES TO RELATED APPLICATION

The present application claims priority under 35 U.S.C. § 119(a) to Korean application number 10-2023-0153546 filed on Nov. 8, 2023, in the Korean Intellectual Property Office, which is incorporated herein by reference in its entirety.

BACKGROUND

1. Technical Field

Various embodiments generally relate to a semiconductor apparatus, and, more particularly, to a semiconductor apparatus and a memory system including the same capable of active internal power control.

2. Related Art

A semiconductor apparatus operates by receiving power (hereinafter, referred to as external power) from an external source, for example, a host such as a controller. The semiconductor apparatus is often designed to satisfy a range of variations in the external power supply voltage specified in operating specifications. Therefore, to satisfy the range of variations in the external power supply voltage, the circuit design of the semiconductor apparatus is based on minimum operating voltage among the range of variations in the external power supply voltage.

Because the circuit design is based on the minimum operating voltage regardless of an actual level of the external power supply voltage, efficiency results.

SUMMARY

In an embodiment, a semiconductor apparatus may include an internal voltage generation circuit and a control circuit. The internal voltage generation circuit may include a plurality of sub-circuits configured to receive an external voltage as an input and configured to generate at least one internal voltage based on the external voltage. The control circuit may be configured to determine where the external voltage falls within a range between a minimum operating voltage and a target operating voltage according to power information and a built-in lookup table and may be configured to control the plurality of sub-circuits according to a result of the determination.

In an embodiment, a semiconductor apparatus may include a first rectification circuit, a pumping circuit, a first switching circuit, a second switching circuit and a control circuit. The first rectification circuit may be configured to receive an external voltage through a first power line and to generate and output a first internal voltage to a second power line. The pumping circuit may be configured to receive the first internal voltage through the second power line and to generate and output a second internal voltage to a third power line. The first switching circuit may be configured to couple the first power line with the second power line. The second switching circuit may be configured to couple the first power line with the third power line. The control circuit may be configured to determine where the external voltage falls within a range between a minimum operating voltage and a target operating voltage according to power information and a built-in lookup table and may be configured to control the first rectification circuit, the pumping circuit, the first switching circuit, and the second switching circuit according to a result of the determination.

In an embodiment, a memory system may include a host and a semiconductor memory apparatus. The host may be configured to output an external voltage and power information regarding a range of the external voltage. The semiconductor memory apparatus may be including a plurality of sub-circuits configured to receive the external voltage as an input and generate at least one internal voltage based on the external voltage, the semiconductor memory apparatus may be configured to determine where the external voltage falls in a range between a minimum operating voltage and a target operating voltage according to the power information and a built-in lookup table, and may be configured to control the plurality of sub-circuits according to a result of the determination.

In an embodiment, a semiconductor apparatus may include an internal voltage generation circuit including a plurality of sub-circuits configured to receive an external voltage as an input and configured to generate at least one internal voltage based on the external voltage; and may include a control circuit configured to, based on the external voltage, control the plurality of sub-circuits to deactivate at least one of the sub-circuits, thereby reducing power utilized by the internal voltage generation circuit.

BRIEF DESCRIPTION OF THE DRAWINGS

FIG. 4A through FIG. 4E are diagrams illustrating control of an internal voltage according to a level of an external voltage according to an embodiment.

DETAILED DESCRIPTION

Various embodiments may improve power consumption efficiency through active internal power control according to a level of an external power supply voltage and reduce power consumption by blocking unnecessary circuit operations.

Hereinafter, embodiments are described in more detail with reference to the accompanying drawings.

Figure 1:
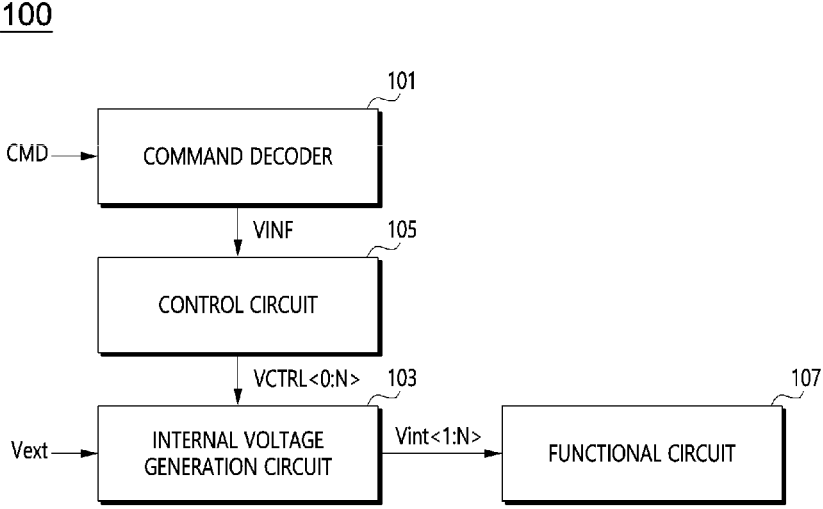
FIG. 1 is a diagram illustrating a configuration of a semiconductor apparatus according to an embodiment.

FIG. 1 is a diagram illustrating a configuration of a semiconductor apparatus 100 according to an embodiment.

Referring to FIG. 1, the semiconductor apparatus 100 according to an embodiment includes a command decoder 101, an internal voltage generation circuit 103, a control circuit 105, and a functional circuit 107.

The command decoder 101 decodes an externally provided or received command signal CMD to generate power information VINE. The power information VINF may include information regarding a range of variation of an externally provided power supply voltage (hereinafter, external voltage) of the semiconductor apparatus 100. As described below, the power information VINF is provided to the semiconductor apparatus 100 in the form of the command signal CMD by encoding a range of variation in the power supply voltage from outside, or external to, the semiconductor apparatus 100.

The internal voltage generation circuit 103 receives an external voltage Vext and a plurality of control signals VCTRL<0:N> as inputs and outputs a plurality of internal voltages Vint<1:N>. The internal voltage generation circuit 103 may include a plurality of sub-circuits (described with reference to FIG. 2) controlled by the plurality of control signals VCTRL<0:N>. The external voltage Vext may include any power supply voltage provided externally to the semiconductor apparatus 100, such as VCC, VDD, and the like.

The control circuit 105 determines where the external voltage Vext falls within a range between a minimum operating voltage and a target operating voltage according to the power information VINF and a built-in lookup table and generates the plurality of control signals VCTRL<0:N> that control the plurality of sub-circuits according to the result of the determination.

The functional circuit 107 is a circuit that performs various functions for operation of the semiconductor apparatus 100 and operates by receiving a plurality of internal voltages Vint<1:N>. The functional circuit 107 may include a memory region for storing data and peripheral circuit coupled to the memory region. The memory region may include a plurality of memory cells, and the plurality of memory cells may include at least one of volatile memory and non-volatile memory. The volatile memory may include SRAM (Static RAM), DRAM (Dynamic RAM), SDRAM (Synchronous DRAM), and the non-volatile memory may include ROM (Read Only Memory), PROM (Programmable ROM), EEPROM (Electrically Erase and Programmable ROM), EPROM (Electrically Programmable ROM), flash memory, PRAM (Phase change RAM), MRAM (Magnetic RAM), RRAM (Resistive RAM), and FRAM (Ferroelectric RAM).

Figure 2:
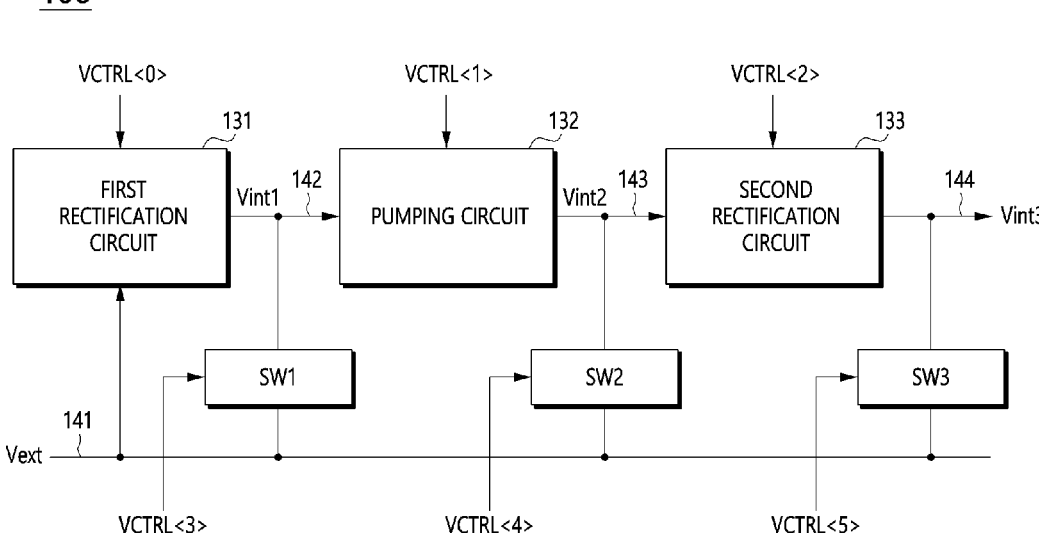
FIG. 2 is a diagram illustrating a configuration of an internal voltage generation circuit of FIG. 1 according to an embodiment.

FIG. 2 is a diagram illustrating a configuration of the internal voltage generation circuit 103 of FIG. 1 according to an embodiment.

Referring to FIG. 2, the internal voltage generation circuit 103 includes a plurality of sub-circuits. FIG. 2 illustrates an example of the plurality of sub-circuits including a first rectification circuit 131, a pumping circuit 132, and a second rectification circuit 133. The internal voltage generation circuit 103 may further include a plurality of switching circuits SW1, SW2, and SW3. The internal voltage generation circuit 103 may include fewer sub-circuits and fewer switching circuits than shown in FIG. 2. For example, the internal voltage generation circuit 103 may include a single rectification circuit, a pumping circuit, and two switching circuits.

The first rectification circuit 131 receive an external voltage Vext as input and generates a first internal voltage Vint1 based on the external voltage Vext. The first rectification circuit 131 is activated/deactivated according to a first control signal VCTRL<0> and adjusts a level or voltage value of the first internal voltage Vint1. The first control signal VCTRL<0> may comprise a plurality of signal bits. The first rectification circuit 131 may receive the external voltage Vext through a first power line 141 and output the first internal voltage Vint1 through a second power line 142.

The pumping circuit 132 receives the first internal voltage Vint1 and generates a second internal voltage Vint2 based on the first internal voltage Vint1. The pumping circuit 132 is activated/deactivated according to a second control signal VCTRL<1> and adjusts a level or voltage value of the second internal voltage Vint2. The second control signal VCTRL<1> may comprise a plurality of signal bits. The pumping circuit 132 may output the second internal voltage Vint2 through a third power line 143.

The second rectification circuit 133 receives the second internal voltage Vint2 as input and generates a third internal voltage Vint3 based on second internal voltage Vint2. The second rectification circuit 133 is activated/deactivated according to a third control signal VCTRL<2> and adjusts a level or voltage value of the third internal voltage Vint3. The third control signal VCTRL<2> may comprise a plurality of signal bits. The second rectification circuit 133 may output the third internal voltage Vint3 through a fourth power line 144.

A first switching circuit SW1, or switch, is coupled between the first power line 141 and the second power line 142. The first switching circuit SW1 electrically connects the first power line 141 and the second power line 142 according to a fourth control signal VCTRL<3>.

A second switching circuit SW2, or switch, is coupled between the first power line 141 and the third power line 143. The second switching circuit SW2 electrically connects the first power line 141 and the third power line 143 according to a fifth control signal VCTRL<4>.

A third switching circuit SW3, or switch, is coupled between the first power line 141 and the fourth power line 144. The third switching circuit SW3 electrically connects the first power line 141 and the fourth power line 144 according to a sixth control signal VCTRL<5>.

Figure 3:
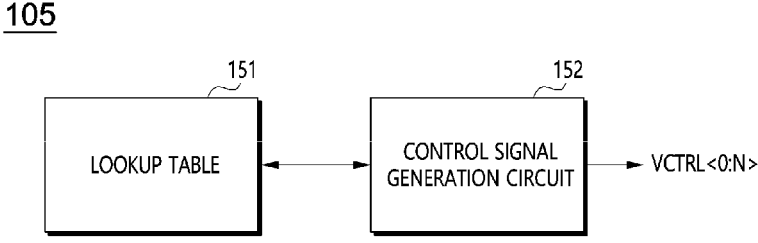
FIG. 3 is a diagram illustrating a configuration of a control circuit of FIG. 1 according to an embodiment.

FIG. 3 is a diagram illustrating a configuration of the control circuit 105 of FIG. 1 according to an embodiment.

Referring to the example of FIG. 3, the control circuit 105 includes a lookup table 151 and a control signal generation circuit 152.

The lookup table 151 stores data including a range of variation of an external voltage Vext for each power information VINF and a minimum operating voltage Vmin and a target operating voltage Vtgt predetermined, for example, when designing the semiconductor apparatus 100. The lookup table 151 may comprise a storage device, such as one-time programmable (OTP) memory or a register.

The table of FIG. 3 is an example of data stored in the lookup table 151, although the range of variation of the external voltage Vext for each power information VINF and the minimum operating voltage Vmin and the target operating voltage Vtgt predetermined when designing the semiconductor apparatus 100 may vary depending on circuit design. For example, the minimum operating voltage Vmin may be predetermined at 2.3 V and the target operating voltage Vtgt may be predetermined at 3.30 V. A power information VINF value of '00' indicates that the external voltage Vext is supplied within a range of 2.30V to 2.57V. A power information VINF value of '01' indicates that the external voltage Vext is supplied within a range of 2.58V to 2.85V. A power information VINF value of '02' indicates that the external voltage Vext is supplied within a range of 3.12V to 3.37V.

The control signal generation circuit 152 includes logic circuits for determining a level or voltage value of the external voltage Vext by referring to or reading values stored in the lookup table 151 according to the power information VINF and generating a plurality of control signals VCTRL<0:N> to match the determination result.

FIG. 4A through FIG. 4E are diagrams illustrating control of an internal voltage according to or based on a level of an external voltage according to an embodiment. A method of controlling an internal voltage according to a level or voltage value of an external voltage is described in accordance with the various states of the internal voltage genera-
tion circuit 103 shown in FIG. 4A through FIG. 4E. The
method may result in reduced power consumption when
circuit operation is decreased, thereby reducing power uti-
lized, for example, by the internal voltage generation circuit
103.

Figure 4A:
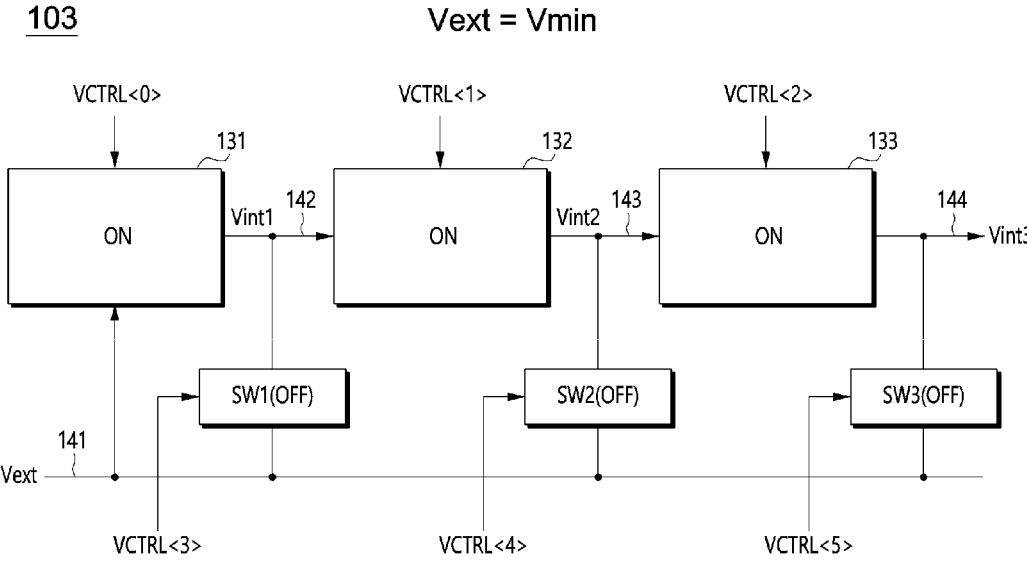

FIG. 4A is a diagram illustrating internal voltage control
when a level of an external voltage Vext and a level of a
minimum operating voltage Vmin are the same. When the
level of the external voltage Vext and the level of the
minimum operating voltage Vmin are the same may indicate
that the level of the minimum operating voltage Vmin is
substantially included within a range of variation of the level
of the external voltage Vext.

Referring to FIG. 4A, when the level of the external
voltage Vext and the level of the minimum operating voltage
Vmin are the same, the internal voltage is generated by
adjusting the level of the external voltage Vext to match the
level of a target operating voltage Vtgt in the internal voltage
generation circuit 103.

At least one of a second internal voltage Vint2 and a third
internal voltage Vint3 may be generated at a level of the
target operating voltage Vtgt by activating the first rectifi-
cation circuit 131, the pumping circuit 132, and the second
rectification circuit 133 while the plurality of switching
circuits SW1, SW2, and SW3 are all deactivated using the
plurality of control signals VCTRL<0:N>. In this example,
the first control signal VCTRL<0>, the second control signal
VCTRL<1>, and the third control signal VCTRL<2> are
enabled or activated while the fourth control signal
VCTRL<3>, the fifth control signal VCTRL<4>, and the
sixth control signal VCTRL<5> are disabled or deactivated.

Figure 4B:
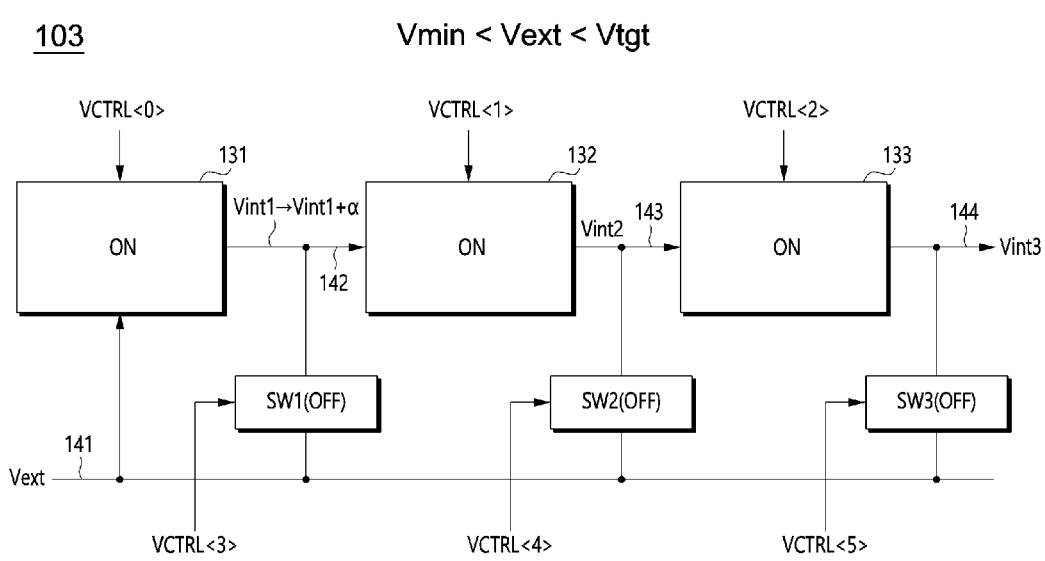
Figure 4C:
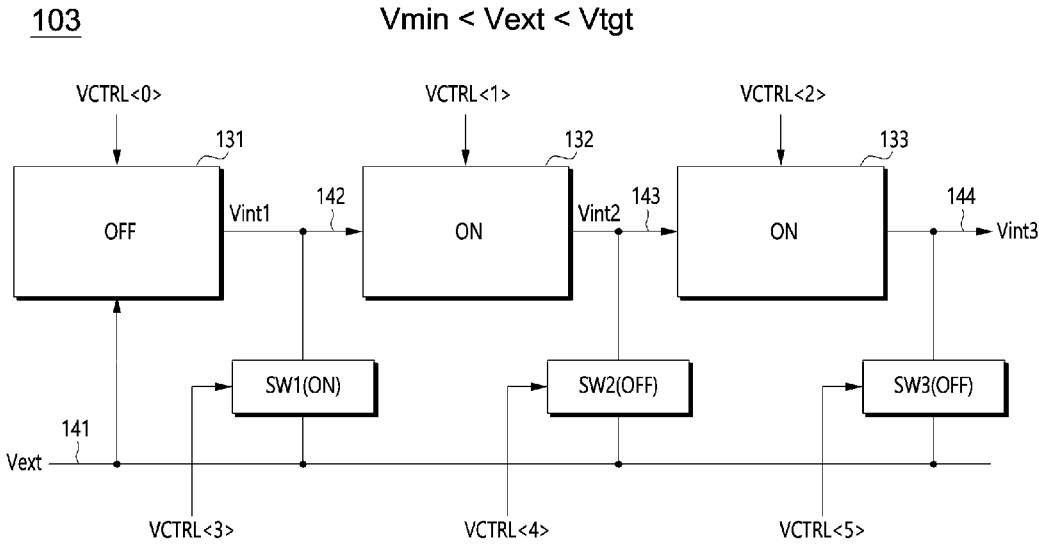

FIG. 4B and FIG. 4C are diagrams illustrating internal
voltage control when a level of the external voltage Vext is
between a minimum operating voltage Vmin and a target
operating voltage Vtgt.

Referring to FIG. 4B, when the level of the external
voltage Vext is between the minimum operating voltage
Vmin and the target operating voltage Vtgt, the internal
voltage may be generated by adjusting the level of the
external voltage Vext to match a level of the target operating
voltage Vtgt in the internal voltage generation circuit 103.

At least one of a second internal voltage Vint2 and a third
internal voltage Vint3 may be generated at the level of the
target operating voltage Vtgt by activating the first rectifi-
cation circuit 131, the pumping circuit 132, and the second
rectification circuit 133 while the plurality of switching
circuits SW1, SW2, and SW3 are all deactivated using the
plurality of control signals VCTRL<0:N>. In this example,
the first rectification circuit 131 is controlled to increase a
level of the output voltage, thus, the first internal voltage
Vint1 is increased by a certain level (+α). Because a voltage
input to the first rectification circuit 131, in other words, a
level of the external voltage Vext, is higher than a level of
the minimum operating voltage Vmin, operating efficiency
of the first rectification circuit 131 may be improved by
increasing a level of the first internal voltage Vint1 by the
certain level (+α). In addition, because the pumping circuit
132 and the second rectification circuit 133 operate accord-
ing to or based on the increased level of the first internal
voltage Vint1 (Vint1+α), operating efficiency of the pump-
ing circuit 132 and the second rectification circuit 133 may
be improved, which in turn may improve operating effi-
ciency of the internal voltage generation circuit 103. In this
example, the first control signal VCTRL<0>, the second
control signal VCTRL<1>, and the third control signal
VCTRL<2> are enabled or activated while the fourth control signal VCTRL<3>, the fifth control signal VCTRL<4>, and
the sixth control signal VCTRL<5> are disabled or deacti-
vated.

Referring to FIG. 4C, when a level of the external voltage
Vext is between a minimum operating voltage Vmin and a
target operating voltage Vtgt, an internal voltage is gener-
ated by using the external voltage Vext as a first internal
voltage Vint1.

The plurality of control signals VCTRL<0:N> used to
activate only the first switching circuit SW1 among the
plurality of switching circuits SW1, SW2, and SW3, deac-
tivate the first rectification circuit 131, and activate the
pumping circuit 132 and the second rectification circuit 133.
For example, the second control signal VCTRL<1>, the
third control signal VCTRL<2>, and the fourth control
signal VCTRL<3> are enabled or activated while the first
control signal VCTRL<0>, the fifth control signal
VCTRL<4>, and the sixth control signal VCTRL<5> are
disabled or deactivated. Because the first switching circuit
SW1 is activated, the first power line 141 and the second
power line 142 are electrically connected such that the
external voltage Vext is provided as the first internal voltage
Vint1.

Based on the first internal voltage Vint1, the pumping
circuit 132 and the second rectification circuit 133 operate to
generate at least one of the second internal voltage Vint2 and
the third internal voltage Vint3 with a target operating
voltage Vtgt level. By preventing the first rectification
circuit 131 from operating, or not activating the first recti-
fication circuit 131, operating efficiency of the internal
voltage generation circuit 103 may be improved.

Embodiments of the present disclosure may optionally
apply one of the internal voltage control methods described
with respect to FIG. 4B and FIG. 4C when a level of the
external voltage Vext falls between a minimum operating
voltage Vmin and a target operating voltage Vtgt.

FIG. 4D and FIG. 4E illustrate internal voltage control
when a level of the external voltage Vext is substantially
equal to a level of the target operating voltage Vtgt. When
the level of the external voltage Vext and the level of the
target operating voltage Vtgt are the same may indicate that
a level of the target operating voltage Vtgt is substantially
included within a range of variation of the level of the
external voltage Vext.

Referring to the example of FIG. 4D, when the level of the
external voltage Vext is substantially equal to the level of the
target operating voltage Vtgt, the internal voltage may be
generated by using the external voltage Vext as the third
internal voltage Vint3.

The plurality of control signals VCTRL<0:N> are used to
activate only the third switching circuit SW3 among the
plurality of switching circuits SW1, SW2, and SW3, and
deactivate the first rectification circuit 131, the pumping
circuit 132, and the second rectification circuit 133. For
example, the sixth control signal VCTRL<5> is enabled or
activated while the first control signal VCTRL<0>, the
second control signal VCTRL<1>, the third control signal
VCTRL<2>, the fourth control signal VCTRL<3>, and the
fifth control signal VCTRL<4> are disabled or deactivated.
Because the third switching circuit SW3 is activated, the first
power line 141 and the fourth power line 144 are electrically
connected such that the external voltage Vext is output as the
third internal voltage Vint3.

By preventing one or more of the first rectification circuit
131, the pumping circuit 132, and the second rectification
circuit 133 from operating, or not activating one or more of
the first rectification circuit 131, the pumping circuit 132, and the second rectification circuit 133, operating efficiency of the internal voltage generation circuit 103 may be improved. Power consumption is reduced when circuit operation is reduced, thereby reducing power utilized, for example, by the internal voltage generation circuit 103.

Referring to the example of FIG. 4E, when a level of the external voltage Vext is substantially equal to a level of the target operating voltage Vtgt, the internal voltage may be generated by using the external voltage Vext as the second internal voltage Vint2.

The plurality of control signals VCTRL<0:N> are used to activate only the second switching circuit SW2 among the plurality of switching circuits SW1, SW2, and SW3, deactivate the first rectification circuit 131 and the pumping circuit 132, and activate the second rectification circuit 133. For example, the third control signal VCTRL<2> and the fifth control signal VCTRL<4> are enabled or activated while the first control signal VCTRL<0>, the second control signal VCTRL<1>, the fourth control signal VCTRL<3>, and the sixth control signal VCTRL<5> are disabled or deactivated. Because the second switching circuit SW2 is activated, the first power line 141 and the third power line 143 are electrically connected such that the external voltage Vext is output as the second internal voltage Vint2. The second rectification circuit 133 operates according to or based on the second internal voltage Vint2 to generate the third internal voltage Vint3.

By preventing the first rectification circuit 131 and the pumping circuit 132 from operating or not activating the first rectification circuit 131 and the pumping circuit 132, operation efficiency of the internal voltage generation circuit 103 may be improved.

Embodiments of the present disclosure may optionally apply one of the internal voltage control methods described with respect to FIG. 4D and FIG. 4E when a level of the external voltage Vext is substantially equal to a level of the target operating voltage Vtgt.

Figure 5:
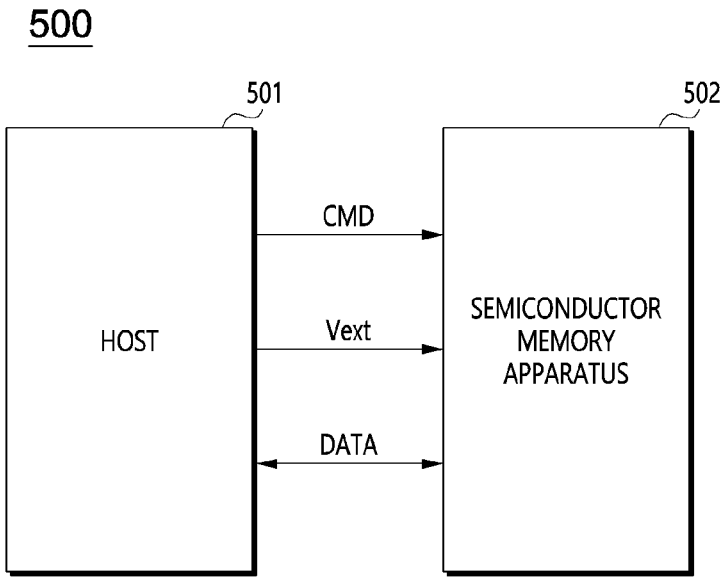
FIG. 5 is a diagram illustrating a configuration of a memory system according to an embodiment.

FIG. 5 is a diagram illustrating a configuration of a memory system 500 according to an embodiment.

Referring to FIG. 5, the memory system 500 according to an embodiment includes a host 501 and a semiconductor memory apparatus 502.

The host 501 may be, for example, a memory controller. The host 501 may provide a voltage, for example, an external voltage Vext, for operation of the semiconductor memory apparatus 502, and may exchange data with the semiconductor memory apparatus 502. The host 501 may provide power information, which includes information about a range of the external voltage Vext, to the semiconductor memory apparatus 502 in the form of a command signal CMD.

The semiconductor memory apparatus 502 may be configured similarly to the semiconductor apparatus 100 described with reference to FIG. 1. The semiconductor memory apparatus 502 may receive the external voltage Vext as an input and may generate at least one internal voltage according to or based on the external voltage Vext. The semiconductor memory apparatus 502 determines where the external voltage Vext falls in a range between a minimum operating voltage Vmin and a target operating voltage Vtgt according to power information and a built-in lookup table and may control a plurality of sub-circuits for generating at least one internal voltage according to the result of the determination. The sub-circuits may include, for example, one or more rectification circuits, one or more voltage regulators, one or more pumping circuits, and so forth.

The semiconductor memory apparatus 502 generates the at least one internal voltage at a target operating voltage Vtgt level by activating the sub-circuits associated with generating the internal voltage when the level of the external voltage Vext and the level of the minimum operating voltage Vmin are the same.

When the level of the external voltage Vext is between the minimum operating voltage Vmin and the target operating voltage Vtgt, the semiconductor memory apparatus 502 may deactivate some of the sub-circuits related to generating the internal voltage and may use the external voltage Vext instead of outputs of deactivated sub-circuits to generate the at least one internal voltage at a level of the target operating voltage Vtgt. For example, the external voltage Vext is input to one of the activated sub-circuits that utilizes the external voltage Vext and not an internally generated voltage as an input. In this example, either the external voltage Vext or an internally generated voltage may be input to the activated sub-circuit, but the sub-circuit that generates the internally generated voltage is deactivated, thus the the external voltage Vext is input to the activated sub-circuit. The ability to switch between inputting the external voltage Vext and an internally generated voltage is advantageous.

When the level of the external voltage Vext falls between the minimum operating voltage Vmin and the target operating voltage Vtgt, the semiconductor memory apparatus 502 may generate the at least one internal voltage at the level of the target operating voltage by activating the sub-circuits related to generating the internal voltage and increasing output levels of some of the sub-circuits.

When the level of the external voltage Vext is substantially equal to the level of the target operating voltage Vtgt, the semiconductor memory apparatus 502 may deactivate all of the sub-circuits associated with generating internal voltage and provide the external voltage Vext as the target operating voltage Vtgt in order to provide the output voltage.

When the level of the external voltage Vext is substantially equal to the level of the target operating voltage Vtgt, the semiconductor memory apparatus 502 may activate only a final circuit, for example, a latest-stage circuit, among the sub-circuits associated with generating the internal voltage, and the final circuit may utilize the external voltage Vext to generate and output the internal voltage at the level of the target operating voltage Vtgt.

A person skilled in the art to which the present disclosure pertains can understand that the present disclosure may be implemented in other specific forms without changing the technical spirit or essential features. Therefore, the embodiments described above are illustrative, not limitative. The scope of the present disclosure is defined by the claims rather than the detailed description, and the meaning and scope of the claims and all changes or modified forms derived from the equivalent concept thereof are included in the scope of the present disclosure.

What is claimed is:

1. A semiconductor apparatus comprising:
an internal voltage generation circuit including a plurality of sub-circuits configured to receive an external voltage as an input and configured to generate at least one internal voltage based on the external voltage;
a control circuit configured to determine where the external voltage falls within a range between a minimum operating voltage and a target operating voltage referring to values stored in a built-in lookup table according to power information and configured to control the plurality of sub-circuits according to a result of the determination; and a command decoder configured to decode a command signal provided outside of the semiconductor apparatus to generate the power information which includes information regarding a range of variation of the external voltage.

2. The semiconductor apparatus of claim 1,
wherein the plurality of sub-circuits include a rectification circuit and a pumping circuit configured to generate the at least one internal voltage based on an output of the rectification circuit.

3. The semiconductor apparatus of claim 1, wherein the internal voltage generation circuit comprises:
a first rectification circuit configured to receive the external voltage and output a first internal voltage;
a pumping circuit configured to receive the first internal voltage and generate a second internal voltage;
a second rectification circuit configured to receive the second internal voltage and generate a third internal voltage; and
a plurality of switching circuits configured to couple the external voltage with one of the first internal voltage, the second internal voltage, and the third internal voltage under control of the control circuit.

4. The semiconductor apparatus of claim 1,
wherein the control circuit is configured to deactivate at least one of the plurality of sub-circuits according to the result of the determination.

5. The semiconductor apparatus of claim 4,
wherein the control circuit is configured to apply the external voltage to one or more activated sub-circuits among the plurality of sub-circuits according to the result of the determination.

6. A semiconductor apparatus comprising:
a first rectification circuit configured to receive an external voltage through a first power line and to generate and output a first internal voltage to a second power line;
a pumping circuit configured to receive the first internal voltage through the second power line and to generate and output a second internal voltage to a third power line;
a first switching circuit configured to couple the first power line with the second power line;
a second switching circuit configured to couple the first power line with the third power line;
a control circuit configured to determine where the external voltage falls within a range between a minimum operating voltage and a target operating voltage referring to values stored in a built-in lookup table according to power information, and configured to control the first rectification circuit, the pumping circuit, the first switching circuit, and the second switching circuit according to a result of the determination; and
a command decoder configured to decode a command signal provided outside of the semiconductor apparatus to generate the power information which includes information regarding a range of variation of the external voltage.

7. The semiconductor apparatus of claim 6,
wherein, when a level of the external voltage and a level of the minimum operating voltage are equal, the control circuit is configured to activate the first rectification circuit and the pumping circuit and configured to deactivate the first and second switching circuits.

8. The semiconductor apparatus of claim 6,
wherein, when a level of the external voltage falls between the minimum operating voltage and the target operating voltage, the control circuit is configured to activate the pumping circuit and the first switching circuit and configured to deactivate the first rectification circuit and the second switching circuit.

9. The semiconductor apparatus of claim 6,
wherein, when a level of the external voltage falls between the minimum operating voltage and the target operating voltage, the control circuit is one of (i) configured to activate the pumping circuit and the first switching circuit and configured to deactivate the first rectification circuit and the second switching circuit and (ii) configured to increase a level of the first internal voltage while activating the first rectification circuit and the pumping circuit and deactivating the first switching circuit and the second switching circuit.

10. The semiconductor apparatus of claim 6,
wherein, when a level of the external voltage is equal to a level of the target operating voltage, the control circuit is configured to deactivate the first rectification circuit, the pumping circuit, and the first switching circuit, and configured to activate the second switching circuit.

11. The semiconductor apparatus of claim 6, further comprising:
a second rectification circuit configured to receive the second internal voltage through the third power line and to generate and output a third internal voltage generated to a fourth power line; and
a third switching circuit configured to couple the first power line with the fourth power line.

12. The semiconductor apparatus of claim 11,
wherein, when a level of the external voltage is equal to a level of target operating voltage, the control circuit is one of (i) configured to deactivate the first rectification circuit, the pumping circuit, the first switching circuit and the third switching circuit, and configured to activate the second rectification circuit and the second switching circuit and (ii) configured to activate the third switching circuit and deactivate the first rectification circuit, the pumping circuit, the second rectification circuit, the first switching circuit, and the second switching circuit.

13. A memory system comprising:
a host configured to output an external voltage and a command signal which includes information regarding a range of the external voltage; and
a semiconductor memory apparatus including a plurality of sub-circuits configured to receive the external voltage as an input and generate at least one internal voltage based on the external voltage, the semiconductor memory apparatus configured to decode the command signal to generate the power information, and configured to determine where the external voltage falls in a range between a minimum operating voltage and a target operating voltage referring to values stored in a built-in lookup table according to the power information and configured to control the plurality of sub-circuits according to a result of the determination.

14. The memory system of claim 13,
wherein, when a level of the external voltage and a level of the minimum operating voltage are equal, the semiconductor memory apparatus is configured to generate the at least one internal voltage at a level of the target operating voltage by activating the plurality of sub-circuits.

15. The memory system of claim 13, wherein, when a level of the external voltage falls between the minimum operating voltage and the target operating voltage, the semiconductor memory apparatus is one of (i) configured to generate the at least one internal voltage at a level of the target operating voltage by activating some of the plurality of sub-circuits and using the external voltage as input to an activated sub-circuit of the plurality of sub-circuits and (ii) configured to generate the at least one internal voltage at the level of the target operating voltage by activating some of the plurality of sub-circuits and increasing output levels of activated sub-circuits.

16. The memory system of claim 13, wherein, when a level of the external voltage is equal to a level of the target operating voltage, the semiconductor memory apparatus is one of (i) configured to deactivate the plurality of sub-circuits and use the external voltage as an output voltage and (ii) configured to activate only a final circuit among the plurality of sub-circuits such that the final circuit receives the external voltage and generates the at least one internal voltage at the level of the target operating voltage.

* * * * *